United States Patent
Iftime et al.

(10) Patent No.: US 7,229,740 B2
(45) Date of Patent: Jun. 12, 2007

(54) REIMAGEABLE PAPER

(75) Inventors: Gabriel Iftime, Mississauga (CA); Peter M. Kazmaier, Mississauga (CA)

(73) Assignee: Xerox Corporation, Stamford, CT (US)

( * ) Notice: Subject to any disclaimer, the term of this patent is extended or adjusted under 35 U.S.C. 154(b) by 7 days.

(21) Appl. No.: 11/220,803

(22) Filed: Sep. 8, 2005

(65) Prior Publication Data

US 2007/0054215 A1 Mar. 8, 2007

(51) Int. Cl.
*G03F 7/004* (2006.01)

(52) U.S. Cl. .................. 430/270.1; 430/19; 430/345

(58) Field of Classification Search ............ 430/270.1, 430/19, 345
See application file for complete search history.

(56) References Cited

U.S. PATENT DOCUMENTS

| 3,961,948 | A | 6/1976 | Saeva |
| 6,067,185 | A | 5/2000 | Albert et al. |
| 6,815,679 | B2 * | 11/2004 | Azuma .................... 250/316.1 |
| 2005/0004361 | A1 * | 1/2005 | Kumar et al. ................. 544/71 |
| 2005/0012998 | A1 * | 1/2005 | Kumar et al. ............... 359/494 |

OTHER PUBLICATIONS

James T.C. Wojtyk et al., "Effects of metal ion complexation on the spiropyran-merocyanine interconversion: development of a thermally stable photo-switch," *J. Chem. Soc. Chem, Comm.*; pp. 1703-1704, 1998.
U.S. Appl. No. 10/834,722, filed Apr. 29, 2004, Iftime et al.
U.S. Appl. No. 10/835,518, filed Apr. 29, 2004, Kazmaier et al.
U.S. Appl. No. 11/123,163, filed May 6, 2005, Iftime et al.
U.S. Appl. No. 11/220,572, filed Sep. 8, 2005, Iftime et al.

* cited by examiner

*Primary Examiner*—Amanda Walke
(74) *Attorney, Agent, or Firm*—Oliff & Berridge PLC

(57) ABSTRACT

An image forming medium includes a substrate and an imaging layer including a photochromic material and a polymer binder coated on the substrate, where the photochromic material exhibits a reversible homogeneous-heterogeneous transition between a colorless state and colored state in the polymer binder.

20 Claims, No Drawings

REIMAGEABLE PAPER

TECHNICAL FIELD

This disclosure is generally directed to documents, and more specifically to reimageable paper, or reimageable transient documents or image forming media, and compositions and methods for making and using such reimageable paper. More particularly, in embodiments, this disclosure is directed to an image forming medium utilizing a composition comprising a photochromic compound dispersed in a polymer binder where the composition exhibits a reversible homogeneous-heterogeneous transition between a colored and a clear state. As a result, the precipitated or phase separated colored form exhibits a very dark gray, or almost black, color. In contrast, prior photochromic materials exhibited high light absorption at only around 570 nm, providing a less contrasting, purple coloration.

CROSS-REFERENCE TO RELATED APPLICATIONS

Disclosed in commonly assigned U.S. patent application Ser. No. 11/123,163, filed May 6, 2005, is an image forming medium, comprising a polymer, a photochromic compound containing chelating groups embedded in the polymer, and a metal salt, wherein molecules of the photochromic compound are chelated by a metal ion from the metal salt.

Disclosed in commonly assigned U.S. patent application Ser. No. 10/835,518, filed Apr. 29, 2004, is an image forming method comprising: (a) providing a reimageable medium comprised of a substrate and a photochromic material, wherein the medium is capable of exhibiting a color contrast and an absence of the color contrast; (b) exposing the medium to an imaging light corresponding to a predetermined image to result in an exposed region and a non-exposed region, wherein the color contrast is present between the exposed region and the non-exposed region to allow a temporary image corresponding to the predetermined image to be visible for a visible time; (c) subjecting the temporary image to an indoor ambient condition for an image erasing time to change the color contrast to the absence of the color contrast to erase the temporary image without using an image erasure device; and (d) optionally repeating procedures (b) and (c) a number of times to result in the medium undergoing a number of additional cycles of temporary image formation and temporary image erasure.

Disclosed in commonly assigned U.S. patent application Ser. No. 10/834,722, filed Apr. 29, 2004, is a reimageable medium comprising: a substrate; and a photochromic material, wherein the medium is capable of exhibiting a color contrast and an absence of the color contrast, wherein the medium has a characteristic that when the medium exhibits the absence of the color contrast and is then exposed to an imaging light corresponding to a predetermined image to result in an exposed region and a non-exposed region, the color contrast is present between the exposed region and the non-exposed region to form a temporary image corresponding to the predetermined image that is visible for a visible time, wherein the medium has a characteristic that when the temporary image is exposed to an indoor ambient condition for an image erasing time, the color contrast changes to the absence of the color contrast to erase the temporary image in all of the following: (i) when the indoor ambient condition includes darkness at ambient temperature, (ii) when the indoor ambient condition includes indoor ambient light at ambient temperature, and (iii) when the indoor ambient condition includes both the darkness at ambient temperature and the indoor ambient light at ambient temperature, and wherein the medium is capable of undergoing multiple cycles of temporary image formation and temporary image erasure.

The entire disclosure of the above-mentioned applications are totally incorporated herein by reference.

BACKGROUND

Many paper documents are promptly discarded after being read. Although paper is inexpensive, the quantity of discarded paper documents is enormous and the disposal of these discarded paper documents raises significant cost and environmental issues. Accordingly, there is a continuing desire for providing a new medium for containing the desired image, and methods for preparing and using such a medium. In aspects thereof it would be desirable to be reusable, to abate the cost and environmental issues, and desirably also is flexible and paper-like to provide a medium that is customarily acceptable to end-users and easy to use and store.

Although there are available technologies for transient image formation and storage, they generally provide less than desirable results for most applications as a paper substitute. For example, alternative technologies include liquid crystal displays, electrophoretics, and gyricon image media. However, these alternative technologies may not in a number of instances provide a document that has the appearance and feel of traditional paper, while providing the desired reimageability.

Imaging techniques employing photochromic materials, that is materials which undergo reversible or irreversible photoinduced color changes are known, for example, U.S. Pat. No. 3,961,948 discloses an imaging method based upon visible light induced changes in a photochromic imaging layer containing a dispersion of at least one photochromic material in an organic film forming binder.

One type of composition that can be used for forming photochromic papers is disclosed in Buncel et al. (J. T. C. Wojtyk, P. M. Kazmaier, E. Buncel, *J. Chem. Soc. Chem. Comm*, 1703, (1998)). The composition exhibits life-times of at least two days for solutions in acetone of spiropyrans modified with chelating groups in the presence of metallic cations. The metal cation $M^{n+}$ can stabilize the open merocyanine form through chelation.

These and other photochromic (or reimageable or electric) papers are desirable because they can provide imaging media that can be reused many times, to transiently store images and documents. For example, applications for photochromic based media include reimageable documents such as, for example, electronic paper documents. Reimageable documents allow information to be kept for as long as the user wants, then the information can be erased or the reimageable document can be re-imaged using an imaging system with different information.

Although the above-described approaches have provided reimageable transient documents, there is a desire for reimageable paper designs that provide longer image life-times, and more desirable paper-like appearance and feel. For example, while the known approaches for photochromic paper provide transient visible images, the visible images have tended to be either purple in color, which provides less image contrast and not the desired black-and-white image, and/or tended to be short in duration such as on the order of several hours, which does not provide adequate life-times for some applications. Furthermore, there is the desire to provide reimageable transient documents that have an appearance and feel comparable to traditional paper, i.e., flexible, capable of being fed through a printer or imager, and having the texture of paper.

SUMMARY

It is desirable for some uses that an image formed on a medium remains stable for extended time periods, for example exceeding a few hours. Electronic paper documents should maintain a written image for as long as the user needs to view it. The image may then be erased or replaced with a different image by the user on command. For electronic paper documents in applications that value viewability for more than several hours, the image should be stable for at least one or two days or beyond this.

The present disclosure addresses these and other needs, in embodiments, by providing an image forming medium utilizing a composition comprising a photochromic compound and a polymer binder where the composition exhibits a reversible homogeneous-heterogeneous transition between a colored and a clear state. The compositions and methods of the present disclosure provide transient images that after formation exhibit a near-black color, which provides a higher image contrast and a more conventional and desired black-and-white image appearance. The compositions and methods of the present disclosure also provide transient images that last for significantly longer periods of time, such as two days or more, before self-erase occurs. These advantages, and others, allow wider application of the reimageable transient documents.

In an embodiment, the present disclosure provides an image forming medium, comprising
a substrate; and
an imaging layer comprising a photochromic material and a polymer binder coated on the substrate,
wherein the photochromic material exhibits a reversible homogeneous-heterogeneous transition between a colorless state and a colored state in the polymer binder.

In another embodiment, the present disclosure provides a method of forming a transient image, comprising:
providing an image forming medium comprising a substrate and an imaging layer comprising a photochromic material and a polymer binder coated on the substrate, wherein the photochromic material exhibits a reversible homogeneous-heterogeneous transition between a colorless state and a colored state in the polymer binder; and
exposing the image forming medium to a UV light in an imagewise manner.

In another aspect, the present disclosure provides a method of making an image forming medium, comprising:
providing a substrate; and
applying to the substrate an imaging layer comprising a photochromic material and a polymer binder, wherein the photochromic material exhibits a reversible homogeneous-heterogeneous transition between a colorless state and a colored state in the polymer binder.

DETAILED DESCRIPTION OF EXEMPLARY EMBODIMENTS

Generally, in various exemplary embodiments, there is provided an reimageable paper or image forming medium formed using a photochromic material, such as a spiropyran, that is dispersed, either completely, substantially, or to a desired degree, in a polymer binder, where the composition exhibits a reversible homogeneous-heterogeneous transition between a colored and a clear state in the polymer binder. By a colored state, in embodiments, refers to for example, the presence of visible wavelengths; likewise, by a colorless state, in embodiments, refers to for example, the complete or substantial absence of visible wavelengths. By "state" in embodiments is a temporary form of the composition, such as a temporary isomeric form of the photochromic material in the solvent. By "homogeneous" in embodiments refers to for example a mixture or solution where the photochromic material is uniformly, or substantially uniformly, dispersed in the polymer binder; heterogeneous in embodiments refers to for example a mixture or solution where the photochromic material is not uniformly dispersed in the polymer binder, such as where some or all of the photochromic material has precipitated or phase separated out of the polymer binder.

For example, the photochromic material and polymer binder are selected such that when the photochromic material is dispersed in the polymer binder, the photochromic material is in its clear state. However, when the photochromic material is exposed to an activating energy, such as ultraviolet light, the photochromic material isomerizes to a more polar form, which reversibly precipitates out of the polymer binder to form a visible material, such as in a crystalline or aggregated form. This precipitation can be reversed, and thus the image "erased" and the photochromic paper returned to a blank state, by various means such as heating the solution to a temperature that reverses the isomerization reaction and resolubilizes or redisperses the photochromic material in the polymer binder, thus returning the photochromic material to its clear state. In the colored state, the image can remain visible for a period of two days or more, providing increased usefulness of the photochromic paper.

In embodiments, the reimageable paper generally comprises an imaging layer comprising a photochromic material dispersed in a polymer binder, with the imaging layer being coated on a suitable substrate material, or sandwiched between a first and a second substrate material (i.e., a substrate material and an overcoat layer).

The photochromic material may exhibit photochromism, which is a reversible transformation of a chemical species induced in one or both directions by absorption of an electromagnetic radiation between two forms having different absorption spectra. The first form is thermodynamically stable and may be induced by absorption of light such as ultraviolet light to convert to a second form. The reverse reaction from the second form to the first form may occur, for example, thermally, or by absorption of light. Various exemplary embodiments of the photochromic material may also encompass the reversible transformation of the chemical species among three or more forms in the event it is possible that reversible transformation occurs among more than two forms. The photochromic material of embodiments may be composed of one, two, three, four, or more different types of photochromic materials, each of which has reversibly interconvertible forms. As used herein, the term "photochromic material" refers to all molecules of a specific species of the photochromic material, regardless of their temporary isomeric forms. For example, where the photochromic material is the species spiropyran, which exhibits isomeric forms as spiropyran and merocyanine, at any given moment the molecules of the photochromic material may be entirely spiropyran, entirely merocyanine, or a mixture of spiropyran and merocyanine. In various exemplary embodiments, for each type of photochromic material, one form may be colorless or weakly colored and the other form may be differently colored.

The photochromic material may be any suitable photochromic material that is useful in providing photochromic paper including, for example, organic photochromic materials, as long as the photochromic material in one of its different states phase separates from the polymer binder when an appropriate polymer binder is used. Examples of photochromic materials include spiropyrans and related compounds like spirooxazines and thiospiropyrans, benzo and naphthopyrans (chromenes), stilbene, azobenzenes, bisimidazols, spirodihydroindolizines, quinines, perimidinespirocyclohexadienones, viologens, fulgides, fulgimides, diarylethenes, hydrazines, anils, aryl disulfides, aryl thiosulfonates and the like. In the aryl disulfides aryl thiosulfonates, suitable aryl groups include phenyl, naphthyl, phenanthrene, anthracene, substituted groups thereof, and the like. These materials can variously undergo heterocyclic cleavage, such as spiropyrans and related compounds; undergo homocyclic cleavage such as hydrazine and aryl disulfide compounds; undergo cis-trans isomerization such as azo compounds, stilbene compounds and the like; undergo proton or group transfer phototautomerism such as photochromic quinines; undergo photochromism via electro transfer such as viologens and the like. Specific examples of materials include:

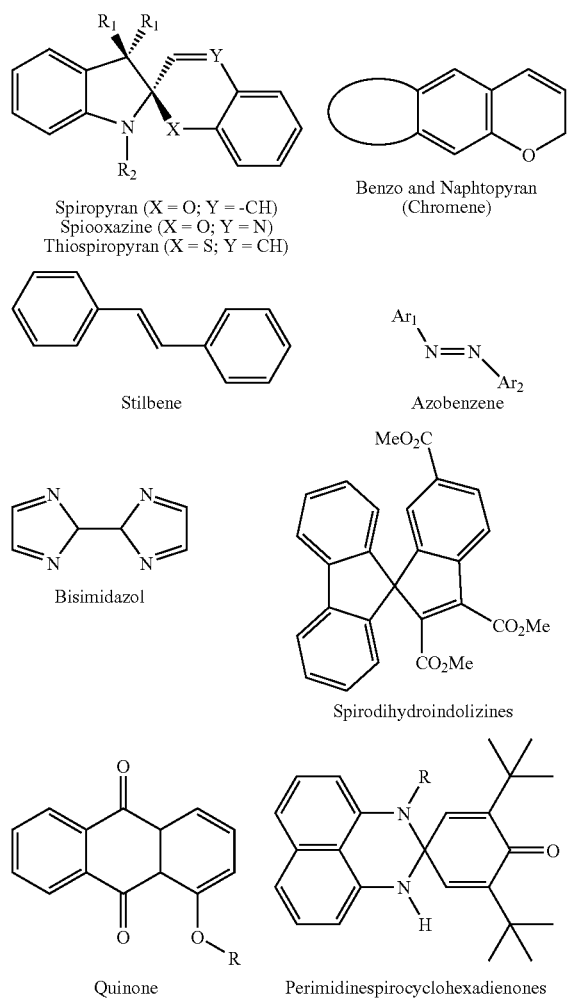

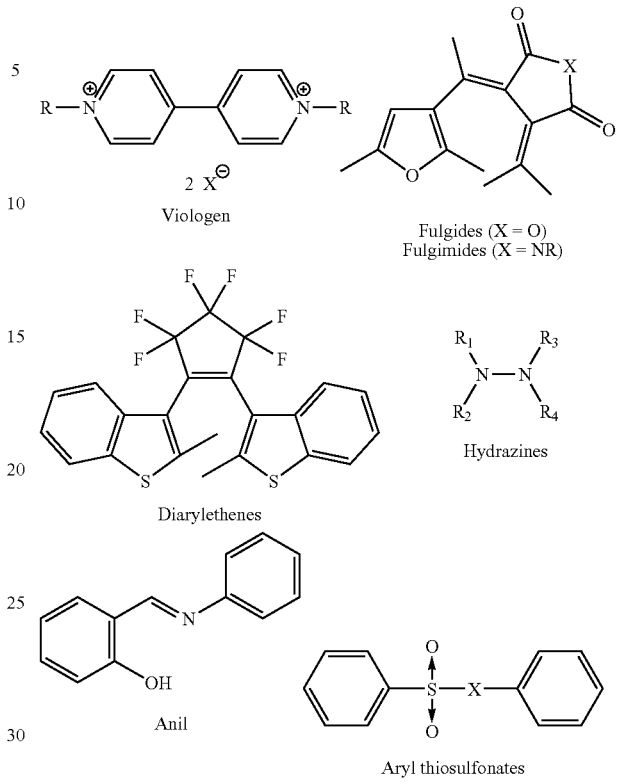

In these structures, the various R groups (i.e., R, $R_1$, $R_2$, $R_3$, $R_4$) can independently be any suitable group including but not limited to hydrogen; alkyl, such as methyl, ethyl, propyl, butyl, and the like, including cyclic alkyl groups, such as cyclopropyl, cyclohexyl, and the like, and including unsaturated alkyl groups, such as vinyl ($H_2C=CH-$), allyl ($H_2C=CH-CH_2-$), propynyl ($HC\equiv C-CH_2-$), and the like, where for each of the foregoing, the alkyl group has from 1 to about 50 or more carbon atoms, such as from 1 to about 30 carbon atoms; aryl, including phenyl, naphthyl, phenanthrene, anthracene, substituted groups thereof, and the like, and having from about 6 to about 30 carbon atoms such as from about 6 to about 20 carbon atoms; arylalkyl; such as having from about 7 to about 50 carbon atoms such as from about 7 to about 30 carbon atoms; silyl groups; nitro groups; cyano groups; halide atoms, such as fluoride, chloride, bromide, iodide, and astatide; amine groups, including primary, secondary, and tertiary amines; hydroxy groups; alkoxy groups, such as having from 1 to about 50 carbon atoms such as from 1 to about 30 carbon atoms; aryloxy groups, such as having from about 6 to about 30 carbon atoms such as from about 6 to about 20 carbon atoms; alkylthio groups, such as having from 1 to about 50 carbon atoms such as from 1 to about 30 carbon atoms; arylthio groups, such as having from about 6 to about 30 carbon atoms such as from about 6 to about 20 carbon atoms; aldehyde groups; ketone groups; ester groups; amide groups; carboxylic acid groups; sulfonic acid groups; and the like. The alkyl, aryl, and arylalkyl groups can also be substituted with groups such as, for example, silyl groups; nitro groups; cyano groups; halide atoms, such as fluoride, chloride, bromide, iodide, and astatide; amine groups, including primary, secondary, and tertiary amines; hydroxy groups; alkoxy groups, such as having from 1 to about 20 carbon atoms such as from 1 to about 10 carbon atoms; aryloxy groups, such as having from about 6 to about 20 carbon atoms such as from about 6 to about 10 carbon atoms; alkylthio groups, such as having from 1 to about 20 carbon atoms such as from 1 to about 10 carbon atoms; arylthio groups, such as having from about 6 to about 20 carbon atoms such as from about 6 to about 10 carbon atoms; aldehyde groups; ketone groups; ester groups; amide groups; carboxylic acid groups; sulfonic acid groups; and the like. $Ar_1$ and $Ar_2$ can independently be any suitable aryl or aryl-containing group including but not limited to phenyl, naphthyl, phenanthrene, anthracene, and the like, and substituted groups thereof including any of the substitutions mentioned above for the alkyl, aryl, and arylalkyl groups. X in the spiropyran formula is a suitable heteroatom such as N, O, S, and the like. Y can be —N— or —CH—. $X^-$ in the Viologen formula can be, for example, $F^-$, $Cl^-$, $Br^-$, $I^-$, $BF_4^-$, $PF_6^-$, $B(C_6H_5)_4^-$ and the like. $X^-$ in the aryl thiosulfonate can be, for example, —O—, S, —NH— and the like.

Particularly suitable in some embodiments are the spiropyrans and related compounds, although any photochromic material may be used as long as the material provides the desired color contrast and reversible solubility or phase separation properties in the polymer binder. For example, spiropyran is suitable because it reversibly isomerizes between a colorless state (spiropyran, SP) to a colored state (merocyanine, MC) under illumination with UV light or application of heat. For this compound, the spiropyran (SP) has low polarity, while merocyanine (MC) has high polarity, due to its dipolar nature. For example, for compound 1 below, the compound reversibly isomerizes between the SP-1 and MC-1 forms as shown below:

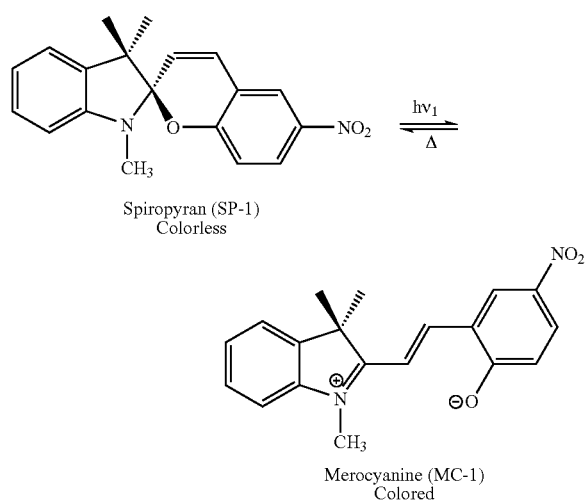

Spiropyran (SP-1)
Colorless

Merocyanine (MC-1)
Colored

Compound 1

That is, upon application of energy such as ultraviolet light, the material converts from a colorless spiropyran (SP-1) with a small dipole moment of about 5 D to a colored, highly conjugated structure of merocyanine (MC-1) with a larger dipole moment of about 11 D (where the unit D (Debye) is 1 D=$3.33 \times 10^{-30}$ C·m). In the reverse isomerization reaction, upon application of energy such as heat, the material isomerizes from the colored merocyanine (MC-1) to the colorless spiropyran (SP-1).

However, in the conventional polymer binder systems, such as polymethyl methacrylate (PMMA) or polystyrene as the polymer binder, both the colorless and the colored forms of the photochromic material remain dispersed in the polymer binder. In this case, the colored form with revert back to the colorless form in hours, not providing the desired long-term viewability. Nevertheless, even these photochromic materials can be used in the present disclosure, if a suitable polymer binder is selected wherein the colorless form remains dispersed in the polymer binder, while the colored form phase separates or precipitates out of the polymer binder.

To increase the inducement of phase separation of the photochromic material in the polymer binder, and especially in the conventional PMMA and polystyrene polymer binder, additional functional groups can be added to the photochromic material to make it less compatible with the selected polymer. For such functionalized photochromic materials, the colorless isomer is soluble in the polymer binder because of the overall low polarity of the photochromic material group. However, the colored isomer form precipitates or phase separates out of the polymer binder because of its higher polarity nature provided by the functional group.

For example, suitable functional groups that can be added to the photochromic material include, but are not limited to, $SO_3H$ groups, carboxylic acid ($CO_2H$) groups, $CONR_2$ groups (where the R groups can be the same or different), $CO_2R$ groups, COX groups or $SO_2X$ groups (where X is a halogen, such as fluorine or chlorine), sulfonamide groups, and the like. The sulfonamide groups can also be unsubstituted ($SO_2NH_2$) or substituted ($SO_2NR_2$, where the R groups can include H, alkyl, aryl, arylalkyl groups and the like as described above for the photochromic materials, and can be the same or different). In another embodiment, sulfonic acid salts (—$SO_3M$) and carboxylic acid salts (COOM) can be suitable functional groups for achieving precipitation of the colored isomer. In these salts, M represents a positive counter ion and can be, for example, metal ions such as $Na^+$, $Li^+$, $Mg^{2+}$, $Ca^{2+}$, $Al^{3+}$, $Zn^{2+}$, $Cu^+$, $Cu^{2+}$ as well as ammonium ions of the general formula, $R^4N^+$ ions where R represents organic radicals that can be identical or different. Such functional groups can be readily incorporated into the photochromic materials by known processes. In some embodiments, the functional group is a carboxylic acid group (—COOH), as this group has very low compatibility with low polarity polymers. Thus, for example, a suitable functionalized spiropyran photochromic material, is compound 2 below, which reversibly isomerizes between the SP-2 and MC-2 forms as shown:

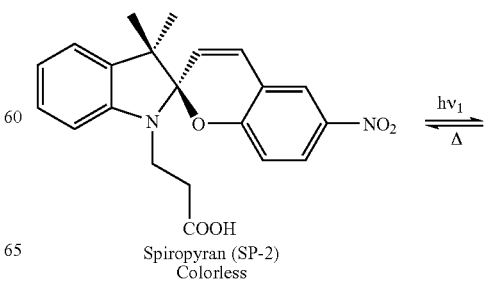

Spiropyran (SP-2)
Colorless

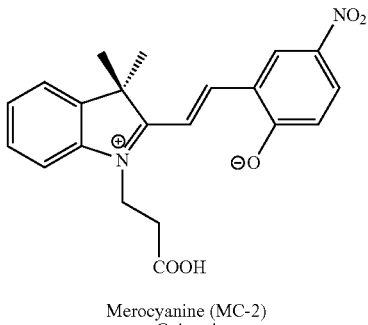

Merocyanine (MC-2)
Colored

Compound 2

That is, upon application of energy such as ultraviolet light, the material isomerizes from a low polarity colorless spiropyran (SP-2) to a high polarity, colored, highly conjugated structure of merocyanine (MC-2). In the reverse isomerization reaction, upon application of energy such as heat, the material isomerizes from the colored merocyanine (MC-2) to the colorless spiropyran (SP-2).

For providing the desired color change, the photochromic material is dispersed in a suitable polymer binder. Any suitable polymer binder can be used for forming the solvent mixture. In some embodiments, the polymer binder can be a non-polar polymer, because such non-polar polymers have good compatibility with the less polar colorless form of the photochromic material, but have poor compatibility for the more polar colored form of the photochromic material, particularly those including functional groups, thus enabling the desired precipitation or phase separation of the colored form from the polymer binder, as described below. For example, suitable examples of polymeric binders include, but are not limited to, polyalkylacrylates like polymethyl methacrylate (PMMA), polycarbonates, polyethylenes, oxidized polyethylene, polypropylene, polyisobutylene, polystyrenes, poly(styrene)-co-(ethylene), polysulfones, polyethersulfones, polyarylsulfones, polyarylethers, polyolefins, polyacrylates, polyvinyl derivatives, cellulose derivatives, polyurethanes, polyamides, polyimides, polyesters, silicone resins, epoxy resins, polyvinyl alcohol, polyacrylic acid and the like. Copolymer materials such as polystyrene-acrylonitrile, polyethylene-acrylate, vinylidenechloride-vinylchloride, vinylacetate-vinylidene chloride, styrene-alkyd resins are also examples of suitable binder materials. The copolymers may be block, random, or alternating copolymers. In some embodiments, polymethyl methacrylate or a polystyrene is the polymer binder, in terms of their cost and wide availability. These polymer binders are particularly desirable for use with the functionalized photochromic materials, as the non-functionalized photochromic material otherwise generally do not phase separate from the polymer binder upon switching from the colorless to the colored form. However, in embodiments, other polymer binders may be used where the polymer binder and photochromic material are mutually selected to provide the desired phase separation upon conversion from the colorless to the colored form. In embodiments, the polymer binder is non-polar, or substantially non-polar. In addition, more polar polymer binders can also be used, if desired, as long as the polymer binder and photochromic material are selected such that the phase separation can still occur.

In examples of compositions, the polymer binder may be present in any desired amount, such as from about 5 to about 99.5 percent by weight of the total composition, such as from about 50 to about 99 percent by weight. Likewise, the photochromic material or mixture of photochromic materials may be present in any desired amount, such as from about 0.05 to about 20 percent by weight of the total solvent mixture, such as from about 0.5 to about 5 percent by weight.

Although much of this disclosure refers to the visible image being formed by the photochromic material undergoing a phase separation to provide a colored state when in the phase separated or precipitated form, the disclosure is not limited to this embodiment. In another embodiment, the polymer binder and photochromic material can be chosen in such a way that the clear or less polar state is not soluble (such as phase separates or precipitates from the polymer binder) but the colored state is soluble or dispersed and is long lasting in the chosen polymer binder. A suitable example is a spiropyran as a photochromic molecule and a polar polymer binder. In this embodiment, the colored state can be achieved by UV illumination, which provides the more polar (colored) isomer. The colored state may be stable under room light because the polar polymer binder favors the formation of the colored isomer. The clear state can be achieved by illumination with, for example, high intensity Visible light.

The photochromic material and polymer binder are suitably selected such that the combined material exhibits a reversible homogeneous-heterogeneous transition or phase separation between a colored and a clear or colorless state. That is, the photochromic material and polymer binder are selected such that the photochromic material remains dispersed in the polymer binder when the photochromic material is in the colorless form, but phase separates or precipitates from the polymer binder upon conversion to the colored form. Although not to be desired to be limited by theory, this difference in compatibility of the colorless and colored forms of the photochromic material with the polymer binder causes the photochromic material to be dispersed in the polymer binder when in the colorless form, but to precipitate or phase separate out of the polymer binder as a visible material when in the colored form. When precipitated or phase separated, the colored form of the photochromic material tends to form crystals or aggregates in embodiments, which absorb visible light over much of the visible spectrum. These crystals or aggregates can be of the order of several microns in size, and are opaque and polydisperse (meaning that not all of the precipitate/aggregate particles are of the same size). As a result, the precipitated or phase separated colored form exhibits a very dark gray, or almost black, color. In contrast, prior photochromic materials exhibited high light absorption at only around 570 nm, providing a less contrasting, purple coloration.

Suitable selection of polymer binder and photochromic material can be readily conducted. For example, suitable selection of the materials can be made by routine testing, measurement, and/or prediction of the relative compatibility of the colorless and colored forms of a particular photochromic material in a particular polymer binder or mixture of polymer binders.

In an embodiment, selection of a suitable photochromic material can be made, for example, by comparing the relative difference in dipole moments of the colorless and colored forms of the photochromic material. For example, to permit the desired precipitation or phase separation of the colored form, it is desired in embodiments that the colorless and colored forms of the photochromic material have different dipole moments, such as that the colored form have a higher or larger dipole moment than of the colorless form. In this embodiment, the colored form can have a dipole moment that is, for example, from about 3 to about 20 D, such as from about 4 or from about 5 D to about 10 or about 15 D, higher than the dipole moment of the colorless form of the photochromic material. In embodiments, the colored form can have a dipole moment that is from about 6, such as from about 7 or from about 8 or more D to about 10 or to about 12 D, higher than the dipole moment of the colorless form of the photochromic material.

Likewise, in an embodiment, selection of a suitable polymer binder for a particular photochromic material can be made, for example, by comparing the relative compatibility of the photochromic material in the polymer binder in both the colorless and colored forms. For example, to permit the desired precipitation or phase separation of the colored form, it is desired in embodiments that the colorless and colored forms of the photochromic material have different compatibilities in the polymer binder, and specifically that the colorless form be compatible with the polymer binder while the colored form is not compatible with the polymer binder. This change in compatibility can arise from, for example, the relative difference in dipole moments of the photochromic material, the presence of functional groups on the photochromic material, and the like, as described above.

In the imaging layer composition of embodiments, the photochromic material is converted from the colorless to the colored state by the application of suitable energy, such as the application of ultraviolet light. The document may then be erased by heating or by illumination with visible light of an appropriate wavelength. An advantage of embodiments, however, is that the photochromic material does not revert to the colorless state at room temperature or under normal visible light. As a result, the colored form of the photochromic material, and thus the visible image, remains stable and visible for up to two days or more.

The photochromic paper may comprise a supporting substrate, coated on at least one side with the imaging layer of photochromic material and polymer binder. As desired, the substrate can be coated on either only one side, or on both sides, with the photochromic material and polymer binder. When the photochromic material is coated on both sides, or when higher visibility of the image is desired, an opaque layer may be included between the supporting substrate and the photochromic material layer or on the opposite side of the supporting substrate from the coated photochromic material layer. Thus, for example, if a one-sided photochromic paper is desired, the photochromic paper may include a supporting substrate, coated on one side with the photochromic material and coated on the other side with an opaque layer such as, for example, a white layer. Also, the photochromic paper may include a supporting substrate, coated on one side with the photochromic material and with an opaque layer there between. If a two-sided photochromic paper is desired, then the photochromic paper may include a supporting substrate, coated on both sides with the photochromic material layer, and with at least one opaque layer interposed between the two coated photochromic material layers. Of course, an opaque supporting substrate, such as conventional paper, may be used in place of a separate supporting substrate and opaque layer, if desired.

Any suitable supporting substrate may be used. For example, suitable examples of supporting substrates include, but are not limited to, glass, ceramics, wood, plastics, paper, fabrics, textile products, polymeric films, inorganic substrates such as metals, and the like. The plastic may be for example a plastic film, such as polyethylene film, polyethylene terepthalate, polyethylene napthalate, polystyrene, polycarbonate, polyethersulfone. The paper may be, for example, plain paper such as XEROX® 4024 paper, ruled notebook paper, bond paper, silica coated papers such as Sharp Company silica coated paper, Jujo paper, and the like. The substrate may be a single layer or multi-layer where each layer is the same or different material. In embodiments, the substrate has a thickness ranging for example from about 0.3 mm to about 5 mm, although smaller or greater thicknesses can be used, if desired.

When an opaque layer is used in the photochromic paper, any suitable material may be used. For example, where a white paper-like appearance is desired, the opaque layer may be formed from a thin coating of titanium dioxide, or other suitable material like zinc oxide, inorganic carbonates, and the like. The opaque layer can have a thickness of, for example, from about 0.01 mm to about 10 mm, such as about 0.1 mm to about 5 mm, although other thicknesses can be used.

If desired, an overcoating layer may also be applied over the applied photochromic material and polymer binder layer. The overcoating layer may, for example, be applied to further adhere the photochromic material and polymer binder in place over the substrate, to provide wear resistance, to improve appearance and feel, and the like. The overcoating layer can be the same as or different from the substrate material, although in embodiments at least one of the overcoating layer and substrate layer is clear and transparent to permit visualization of the formed image. The overcoating layer can have a thickness of, for example, from about 0.01 mm to about 10 mm, such as about 0.1 mm to about 5 mm, although other thicknesses can be used.

In embodiments where the photochromic material is coated on the substrate, the coating can be conducted by any suitable method available in the art, and the coating method is not particularly limited.

In its method aspects, the present disclosure involves providing a reimageable medium composed of a substrate and an imaging layer comprising a photochromic material and a polymer binder, wherein the imaging layer exhibits a reversible homogeneous-heterogeneous transition between a colored and a clear state to exhibit a color contrast and an absence of the color contrast. The reimageable medium is exposed to an imaging light corresponding to a predetermined image to result in an exposed region and a non-exposed region, wherein the color contrast is present between the exposed region and the non-exposed region to allow a temporary image corresponding to the predetermined image to be visible to the naked eye.

The imaging light used to form the transient image may have any suitable predetermined wavelength scope such as, for example, a single wavelength or a band of wavelengths. In various exemplary embodiments, the imaging light is an ultraviolet (UV) light having a single wavelength or a narrow band of wavelengths selected from the UV light wavelength range of about 200 nm to about 475 nm, such as a single wavelength at about 365 nm or a wavelength band of from about 360 nm to about 370 nm. For forming the image, the reimageable medium may be exposed to the imaging light for a time period ranging from about 10 milliseconds to about 5 minutes, particularly from about 30 milliseconds to about 1 minute. The imaging light may have an intensity ranging from about 0.1 mW/cm$^2$ to about 100 mW/cm$^2$, particularly from about 0.5 mW/cm$^2$ to about 10 mW/cm$^2$.

In various exemplary embodiments, imaging light corresponding to the predetermined image may be generated for example by a computer or a Light Emitting Diode (LED) array screen and the temporary image is formed on the reimageable medium by placing the medium on or in proximity to the LED screen for the desired period of time. In other exemplary embodiments, a UV Raster Output Scanner (ROS) may be used to generate the UV light in an image-wise pattern. Other suitable imaging techniques that can be used include, but are not limited to, irradiating a UV light onto the image forming medium through a mask, irradiating a pinpoint UV light source onto the image forming medium in an imagewise manner such as by use of a light pen, and the like.

To erase the image from the photochromic paper in one embodiment, the photochromic paper bearing the image may be subjected to an indoor ambient condition for an image erasing time in order to change the color contrast to the absence of color contrast. Thus, the image can, in embodiments, be erased without using an image erasure device or technique, and the image is visible only for a period of time sufficient for a user to view the image, but the period of time is also limited in order to allow the user to repeat the procedures of image formation and image erasure a number of times. As such, the medium may undergo a number of cycles of image formation and image erasure. For example, the medium may undergo image formation and image erasure of from about 2 to about 100 or about 500 or more times, such as from about 2 or about 5 or about 10 to about 40 or about 50 or more times. Accordingly, the re-imageable medium may be considered "self-erasing." However, because the colored form of the photochromic material is stable in embodiments, this self-erasure under ambient conditions may take as long as two days to two weeks or more.

In other embodiments, where faster erasure is desired so that a new image can be formed, erasure may be conducted by heating the photochromic paper to an elevated temperature. For example, heating can be conducted at a temperature of from about 50 to about 500° C., such as from about 100 to about 200° C., to enable erasure of the image. Although not limited by any specific theory, it is believed that this heating process causes the polymer binder to re-solubilize or re-disperse the photochromic material, returning the photochromic material to its colorless form.

According to various exemplary implementations, the color contrast that renders the image visible to an observer may be a contrast between, for example two, three or more different colors. The term "color" may encompass a number of aspects such as hue, lightness and saturation, where one color may be different from another color if the two colors differ in at least one aspect. For example, two colors having the same hue and saturation but are different in lightness would be considered different colors. Any suitable colors such as, for example, red, white, black, gray, yellow, cyan, magenta, blue, and purple, can be used to produce a color contrast as long as the image is visible to the naked eye of a user. In various exemplary embodiments, the following exemplary color contrasts may be used: purple temporary image on a white background; yellow temporary image on a white background; dark purple temporary image on a light purple background; and light purple temporary image on a dark purple background. However, in terms of desired maximum color contrast, a desirable color contrast is a dark gray or black image on a light or white background, such as a gray, dark gray, or black image on a white background, or a gray, dark gray, or black image on a light gray background.

In various exemplary embodiments, the color contrast may change such as, for example, diminish during the visible time, but the phrase "color contrast" may encompass any degree of color contrast sufficient to render an image discernable to a user regardless of whether the color contrast changes or is constant during the visible time.

In various exemplary embodiments, the color contrast of the image on the photochromic paper may be maintained for a period of time of, for example, at least about one day or more, at least about two days or more, or at least about four days or more, and for up to about four days, about one, about two, about three, or about four weeks, or more. For example, in order to enable its use as long-term electronic paper, the color contrast of the temporary image on the photochromic paper in embodiments may be maintained for a period of time of at least about two days or at least about four days to about one or about two weeks, or for at least about one week or at least about two weeks to at least about three weeks or at least about four weeks.

An example is set forth hereinbelow and is illustrative of different compositions and conditions that can be utilized in practicing the disclosure. All proportions are by weight unless otherwise indicated. It will be apparent, however, that the disclosure can be practiced with many types of compositions and can have many different uses in accordance with the disclosure above and as pointed out hereinafter.

EXAMPLES

Example 1

Compound 2, a spiropyran photochromic material having a carboxylic acid functional group, was synthesized according to the following scheme:

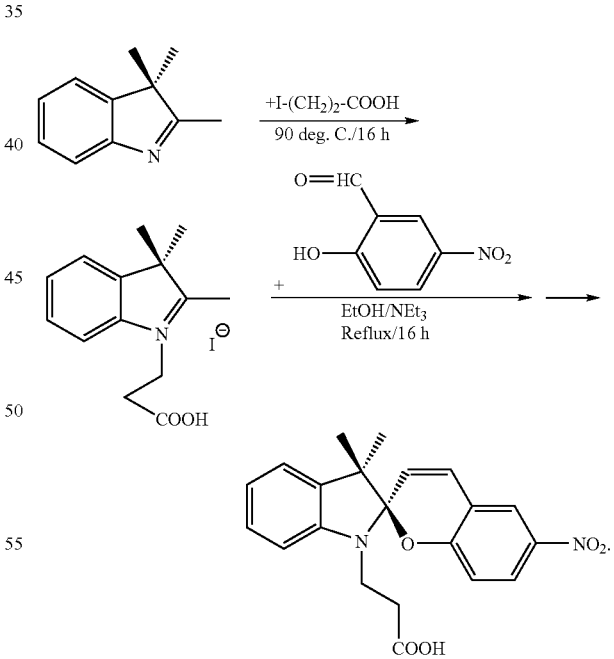

Compound 2

The overall yield of the synthesis was 82%. The compound was recrystallized from anhydrous ethanol to provide a powder compound. The compound was pure, as confirmed by $^1$H-NMR.

Example 2

50 mg of compound 2 of Example 1 are dissolved in a solution of polystyrene in THF as a solvent (2.5 ml). A paper sheet is coated with this solution by using a blade. The sheet is allowed to dry in order to remove solvent.

The coated paper is illuminated with UV light at a wavelength of 365 nm for one minute to obtain a colored state. Initially, the color is a very dark purple, but in a few minutes the color fades to a dark gray color. Immediately after exposure to UV light, the colored state is formed of precipitated material (black color) and purple color. The purple color is attributed to a small amount of the merocyanine (compound MC-2, colored state of spiropyran compound SP-2) still dispersed in the polymer binder. The purple color faded in hours, as expected when the merocyanine remains dispersed in the polymer binder rather than precipitated or phase separated out as a stable, dark-colored solid.

Comparative Example 1

For comparison to Example 2, a similar coated paper was made using a similar but non-functionalized siropyran compound. Namely, instead of using the —COOH functionalized compound 2 (SP-2) of Example 1, a similar compound without the —COOH functionalization (SP-1, shown above) was used in the polystyrene binder. In this combination of photochromic material and polymer binder, the photochromic material was compatible in the polymer binder in both the colorless and colored forms, meaning that the colored form did not phase separate from the polymer binder. The coated paper was exposed to UV light in the same manner as Example 2. In the case of the sample made using a polymer binder that was compatible with the colorless and the colored forms of the spiropyran, the color faded about one day after illumination.

Example 3

An alternative transient document sheet is made in the same manner as Example 2, except that the paper substrate is replaced by a PET plastic sheet. In this Example, the coating solution of Example 2 is applied to a sheet of plastic (PET) on one side. The coated paper is imaged as in Example 2. The sheet has the same long lived image feature. However, the coated PET sheet has an advantage over coated paper in that the coated PET sheet can be erased faster because it can be heated at higher temperatures, when compared with paper substrate version.

It will be appreciated that various of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

What is claimed is:

1. An image forming medium, comprising:
   a substrate; and
   an imaging layer comprising a photochromic material and a polymer binder coated on said substrate,
   wherein the photochromic material and the polymer binder are selected so that:
   the photochromic material exhibits a reversible homogeneous-heterogeneous transition between a colorless state and a colored state in the polymer binder;
   the photochromic material in its colorless state remains dispersed in the polymer binder, but phase separates from the polymer binder when the photochromic material is in its colored state; and
   the photochromic material in its colored state phase separates out of the polymer binder in the form of opaque, polydisperse crystals.

2. The image forming medium of claim 1, wherein the polymer binder is compatible with the photochromic material when the photochromic material is in its colorless state.

3. The image forming medium of claim 1, wherein the polymer binder is incompatible with the photochromic material when the photochromic material is in its colored state.

4. The image forming medium of claim 1, wherein the photochromic compound is selected from the group consisting of a spiropyran compound, spirooxazine, thiospiropyran, a benzo compound, naphthopyran, stilbene, azobenzene, bisimidazol, spirodihydroindolizine, quinine, perimidinespirocyclohexadienone, viologen, fulgide, fulgimide, diarylethene, hydrazine, anil, aryl disulfide, and aryl thiosulfonate.

5. The image forming medium of claim 1, wherein the photochromic compound includes at least one functional group.

6. The image forming medium of claim 5, wherein the at least one functional group is selected from the group consisting of $SO_3H$ groups, $CO_2H$ groups, $SO_3M$ groups wherein M represents a positive metal ion or ammonium, COOM groups wherein M represents a positive metal ion or ammonium, $CONR_2$ groups, $CO_2R$ groups, COX groups or $SO_2X$ groups, sulfonamide groups, $SO_2NH_2$ groups, and $SO_2NR_2$ groups, wherein X is a halogen, and each R is independently H, alkyl, aryl, or arylalkyl groups having from 1 to about 50 carbon atoms.

7. The image forming medium of claim 1, wherein the photochromic compound is a spiropyran compound functionalized with a —COOH group.

8. The image forming medium of claim 1, wherein the photochromic material in its colored state has a dipole moment that is greater than a dipole moment of the photochromic material in its colorless state.

9. The image forming medium of claim 1, wherein the dipole moment of the photochromic material in its colored state is from about 3 D to about 15 D higher than a dipole moment of the photochromic material in its colorless state.

10. The image forming medium of claim 1, wherein the polymer binder is a nonpolar polymer binder.

11. The image forming medium of claim 1, wherein the polymer binder is selected from the group consisting of polyethylene, polypropylene, polystyrene, polyisoprene, and polyisobutylene.

12. The image forming medium of claim 1, wherein the polymer binder is selected from the group consisting of polymethyl methacrylate, polycarbonates, polystyrenes, poly(styrene)-co-(ethylene), polysulfones, polyethersulfones, polyarylsulfones, polyarylethers, polyolefins, polyacrylates, polyvinyl derivatives, cellulose derivatives, polyurethanes, polyamides, polyimides, polyesters, silicone resins, epoxy resins, polyvinyl alcohol, polyacrylic acid, polystyrene-acrylonitrile, polyethylene-acrylate, vinylidenechloride-vinylchloride, vinylacetate-vinylidene chloride, styrene-alkyd resins, and mixtures and copolymers thereof.

13. The image forming medium of claim 1, wherein the photochromic material is converted from its colorless state to its colored state by application of ultraviolet light, and is converted from its colored state to its colorless state by heating at a temperature of from about 100° C. to about 500° C.

14. The image forming medium of claim 1, wherein a stability of the image forming medium is from about two days to about four weeks.

15. The image forming medium of claim 1, wherein the substrate is selected from the group consisting of glass, ceramic, wood, plastic, paper, fabric, textile, metals, plain paper, and coated paper.

16. A method of forming a transient image, comprising:
providing an image forming medium comprising:
   a substrate; and
   an imaging layer comprising a photochromic material and a polymer binder coated on said substrate,
   wherein the photochromic material and the polymer binder are selected so that:
      the photochromic material exhibits a reversible homogeneous-heterogeneous transition between a colorless state and a colored state in the polymer binder,
      the photochromic material in its colorless state remains dispersed in the polymer binder, but phase separates from the polymer binder when the photochromic material is in its colored state; and
      the photochromic material in its colored state phase separates out of the polymer binder in the form of opaque, polydisperse crystals; and
   irradiating the image forming medium with imaging light corresponding to a predetermined image in an imagewise manner.

17. The method of claim 16, wherein the exposing is for a time period ranging from about 10 milliseconds to about 5 minutes at an intensity ranging from about 0.1 mW/cm$^2$ to about 100 mW/cm$^2$.

18. The method of claim 16, further comprising:
erasing the image by heating the image forming medium at a temperature above about 100° C.

19. A method of making an image forming medium, comprising:
providing a substrate; and
applying to the substrate an imaging layer comprising a photochromic material and a polymer binder, wherein the photochromic material and the polymer binder are selected so that the photochromic material exhibits a reversible homogeneous-heterogeneous transition between a colorless state and a colored state in the polymer binder; the photochromic material in its colorless state remains dispersed in the polymer binder, but phase separates from the polymer binder when the photochromic material is in its colored state; and wherein the photochromic material in its colored state phase separates out of the polymer binder in the form of opaque, polydisperse crystals.

20. The method of claim 19, further comprising drying said imaging layer.

* * * * *